United States Patent
Gil et al.

(10) Patent No.: US 12,323,056 B2
(45) Date of Patent: Jun. 3, 2025

(54) EFFICIENT SWITCHING OF OUTPUT STAGE POWER DRIVER

(71) Applicant: Intel Corporation, Santa Clara, CA (US)

(72) Inventors: Lior Gil, Haifa (IL); Kosta Luria, Pardesiya M (IL); Michael Zelikson, Haifa HA (IL)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 17/645,894

(22) Filed: Dec. 23, 2021

(65) Prior Publication Data

US 2022/0115952 A1 Apr. 14, 2022

(51) Int. Cl.
*H02M 3/158* (2006.01)
*H02M 1/00* (2006.01)

(52) U.S. Cl.
CPC ........... *H02M 3/158* (2013.01); *H02M 1/008* (2021.05)

(58) Field of Classification Search
CPC ............................. H02M 3/158; H02M 1/008
See application file for complete search history.

(56) References Cited

U.S. PATENT DOCUMENTS

| | | | | |
|---|---|---|---|---|
| 5,926,038 A * | 7/1999 | Fouts | ................. | H03K 19/0963 326/122 |
| 9,443,567 B1 * | 9/2016 | Dudulwar | ........... | H04L 27/0002 |
| 10,333,689 B2 * | 6/2019 | Dudulwar | ................ | G11C 7/10 |
| 2007/0211526 A1 * | 9/2007 | Burnett | ................. | G11C 11/413 365/177 |
| 2012/0194253 A1 * | 8/2012 | Srivastava | ..... | H03K 19/018528 327/333 |
| 2016/0149564 A1 * | 5/2016 | Huang | ................... | H03K 5/134 327/277 |

* cited by examiner

*Primary Examiner* — Rafael O De Leon Domenech
(74) *Attorney, Agent, or Firm* — Schwegman Lundberg & Woessner, P.A.

(57) ABSTRACT

The circuits and methods described herein provide technical solutions for technical problems facing power driver circuits. To reduce or eliminate effects associated with a gate capacitance discharge current and inconsistent effective $V_{bias}$, the discharge process may be split into two phases. During a first phase, the transistor gate charge is drained into ground through a large path gate. The ground (GND) features a very low impedance, hence the resulting $\delta V_{bias}(t)|_{phase\_1}$ is negligible even for high discharge currents. The transistor gate node voltage ($V_{gate}$) is constantly monitored, and the discharge process switches from the first phase to the second phase when $V_{gate}$ transgresses a bias voltage threshold based on the target value of $V_{bias}$. To switch from the first phase to the second phase, the current path into GND is cut by switching its path gate to an OFF state, and an alternative path is enabled between transistor gate charge and $V_{bias}$.

20 Claims, 5 Drawing Sheets

EFFICIENT SWITCHING OF OUTPUT STAGE POWER DRIVER

TECHNICAL FIELD

Embodiments described herein generally relate to power driver circuits.

BACKGROUND

Power driver circuits (e.g., power amplifiers, voltage regulators) may include a biased output power stage. In these circuits, instead of switching the gate terminal of transistors that form the power stage between rails, the gate terminal may be switched between a certain analog bias voltage $V_{bias}$ and a rail voltage. A p-channel field-effect transistor (PFET) may switch between a supply voltage $V_{CC}$ and $V_{bias}$, and an n-channel FET (NFET) may switch between a ground voltage $V_{SS}$ and $V_{bias}$.

Multiple transistors may be combined in a power stage transistor cluster (PTC). Because these PTCs usually feature relatively high gate capacitance, a PTC switching event is often associated with a transfer of large amount of gate charge. For example, when a PTC is switched from an OFF state to an ON state, the PTC gate voltage may be reduced from $V_{CC}$ to $V_{bias}$ (e.g., with respect to ground), leading to a gate capacitance discharge current, $I_{disch}(t)$. Consequently, the effective $V_{bias}$ ($V_{bias\_eff}$) may no longer be constant, as $V_{bias\_eff}(t) = V_{bias} + \delta V_{bias}(t)$, where $\delta V_{bias}(t)$ is a voltage drop on a $V_{bias}$ circuit output impedance ($Z_{OUT\_UGB}$) due to $I_{disch}(t)$ flow through the $V_{bias}$ circuit. This inconsistency in the $V_{bias\_eff}$ is undesirable, and it leads to a partial or critical degradation in the performance of a power stage.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The circuits and methods described herein provide technical solutions for technical problems facing power driver circuits. To reduce or eliminate effects associated with a gate capacitance discharge current and inconsistent effective $V_{bias}$, the discharge process may be split into two phases. During a first phase, the transistor gate charge is drained into ground through a large path gate. The resulting discharge path into ground (GND) features a very low impedance, hence the resulting $\delta V_{bias}(t)|_{phase\_1}$ is negligible even for high discharge currents. The transistor gate node voltage ($V_{gate}$) is constantly monitored, and the discharge process switches from the first phase to the second phase when $V_{gate}$ transgresses (e.g., reaches or falls below) a voltage bias threshold based on the target value of $V_{bias}$. To switch from the first phase to the second phase, the current path into GND is cut by switching its path gate to an OFF state, and an alternative path is enabled between transistor gate charge and $V_{bias}$. Because the gate node voltage is close to the target $V_{bias}$, the residual charge and the associated current are very low, and $\delta V_{bias}(t)|_{phase\_1}$ is also negligible.

These solutions provide various advantages, including improved switching speed for a large driver output stage without requiring dedicated silicon area for decoupling. These solutions provide improved performance over solutions that attempt to lower the deviation from the desired voltage $\delta V_{bias}(t)$ by increasing the switching transition time, where the increased switching transition time may be inconsistent with the intended usage scenario and lead to an increase in power dissipation for push-pull NFET and PFET output stage configurations. These solutions also provide improved usage of silicon area over solutions that add decoupling capacitance to a bias junction to reduce deviation from the desired voltage $\delta V_{bias}(t)$, which may lead to a substantial power stage area penalty, may become technology-dependent (e.g., may require metal-insulator-metal (MIM) capacitance), and may lead to significant layout complications or layout infeasibility.

In the following description, for purposes of explanation, numerous specific details are set forth to provide a thorough understanding of some example embodiments. It will be evident, however, to one skilled in the art that the present disclosure may be practiced without these specific details.

Figure 1:
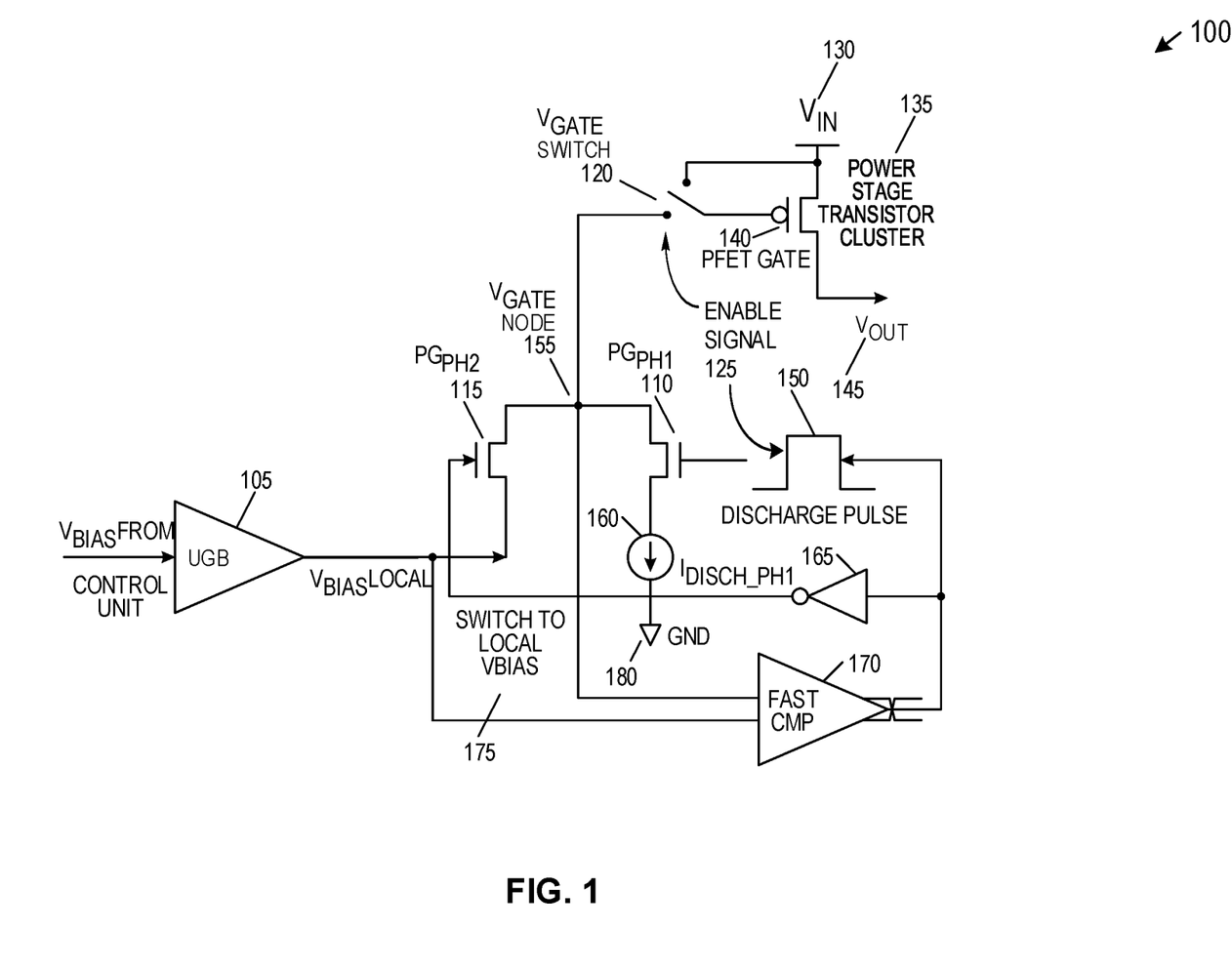
FIG. 1 is a circuit diagram illustrating a gate discharge circuit, according to an embodiment.

FIG. 1 is a circuit diagram illustrating a gate discharge circuit 100, according to an embodiment. While the two-phase operation is shown in FIG. 1 and described herein with respect to a PFET circuit switching the PFET between $V_{CC}$ and $V_{bias}$, an analogous NFET circuit and similar set of operations may be used to switch an NFET between a $V_{SS}$ and $V_{bias}$. Gate discharge circuit 100 includes mutually exclusive first phase gate $PG_{PH1}$ 110 and second phase gate $PG_{PH2}$ 115. In the first phase, PFET gate 140 is connected through a gate voltage node 155 and through $PG_{PH1}$ 110 to GND 180. In the second phase, PFET gate 140 is connected to $V_{bias}$ from Unity Gain Buffer (UGB) 105, where the UGB 105 may be used to provide a local $V_{bias}$ based on a $V_{bias}$ provided by a control unit. A controlled current source $I_{disch\_ph1}$ 160 (e.g., post-Si trimmable) may be used to provide a smooth but fast discharge of charging the PTC gate 140, such as to reduce or eliminate current surges on the input supply side. A fast comparator 170 may be used to switch $PG_{PH1}$ 110 and $PG_{PH2}$ 115 from the first phase to the second phase by outputting a comparator signal when $V_{gate}$ transgresses a voltage bias threshold, where the voltage bias threshold may be set equal to the $V_{bias}$ level.

An enable signal 125 may be used to initiate the first phase. The enable signal 125 switches a $V_{gate}$ switch 120 to connect the PFET gate 140 through gate voltage node 155 to $PG_{PH1}$ 110. The enable signal 125 also provides a discharge pulse 150 that leads to switching $PG_{PH1}$ 110 into an ON state, and $I_{disch\_ph1}$ 160 discharges PFET gate 140 through $PG_{PH1}$ 110 to GND 180. Once the $V_{gate}$ transgresses the voltage bias threshold, the output of the fast comparator 170 changes its output state, causing $PG_{PH1}$ 110 to transition into an OFF state. This comparator output signal is also fed into an inverter 165, which is used to switch $PG_{PH2}$ 115 to an ON state, and the UGB 105 pulls $V_{gate}$ to the target local $V_{bias}$ level 175. The fast comparator 170 may be selected to reduce or minimize current from the UGB 105, such as by selecting a fast comparator 170 that provides fast response, low offset, and high gain. Once the UGB 105 pulls $V_{gate}$ to the target level, the PTC 135 conducts between $V_{IN}$ 130 and $V_{OUT}$ 145, while featuring the desired $R_{DS\_ON}$ resistance value.

Figure 2:
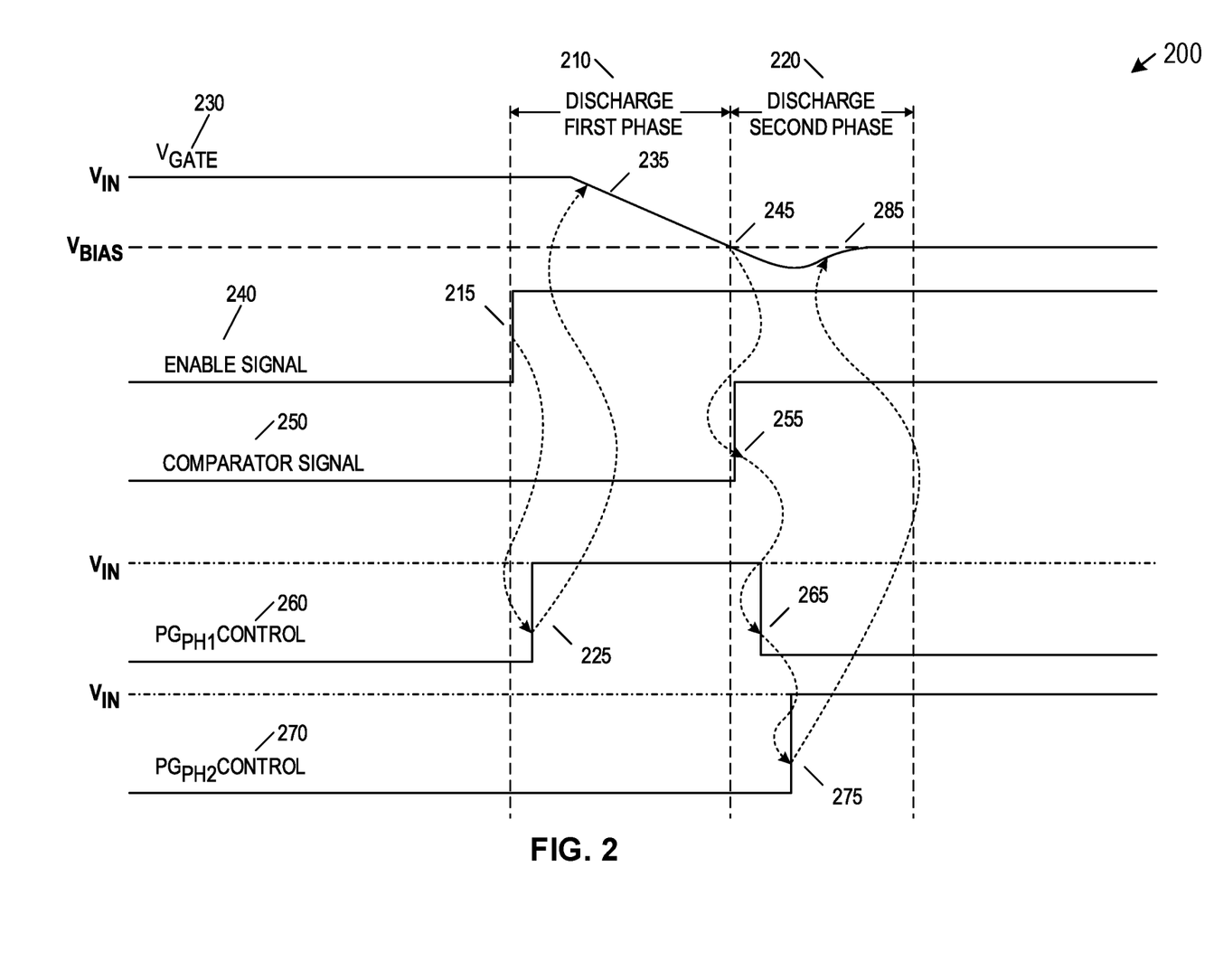
FIG. 2 is a gate discharge scheme timing diagram, according to an embodiment.

FIG. 2 is a gate discharge scheme timing diagram 200, according to an embodiment. Timing diagram 200 shows the timing of voltage level transitions before, during, and after first phase 210 and second phase 220. Initially, $V_{gate}$ 230 may be pulled high, such as when the PFET gate is connected to $V_{IN}$ of a PTC. An enable signal 240 may initiate the first phase 210 by transitioning from low to high 215, which in turn connects the PFET gate to the first phase gate and causes $PG_{PH1}$ control 260 to transition from low to high 225. While the $PG_{PH1}$ control 260 is high, the first phase gate drains the PFET gate to ground through a controlled current source, resulting in a $V_{gate}$ 230 decreased voltage 235. A comparator compares $V_{gate}$ 230 and $V_{bias}$, and when $V_{gate}$ 230 meets or falls transgresses the voltage bias threshold set based on $V_{bias}$ at 245, the comparator transitions from the first phase 210 to the second phase 220 by transitioning the comparator signal 250 from low to high 255. The comparator signal 250 is provided to the first phase gate, which causes $PG_{PH1}$ control 260 to transition from high to low 265. The comparator signal 250 is also provided through an inverter to the second phase gate, which causes $PG_{PH2}$ control 270 to transition from low to high 275, which passes a $V_{bias}$ to the PFET gate and pulls $V_{gate}$ 230 to the target $V_{bias}$ at 285.

Figure 3:
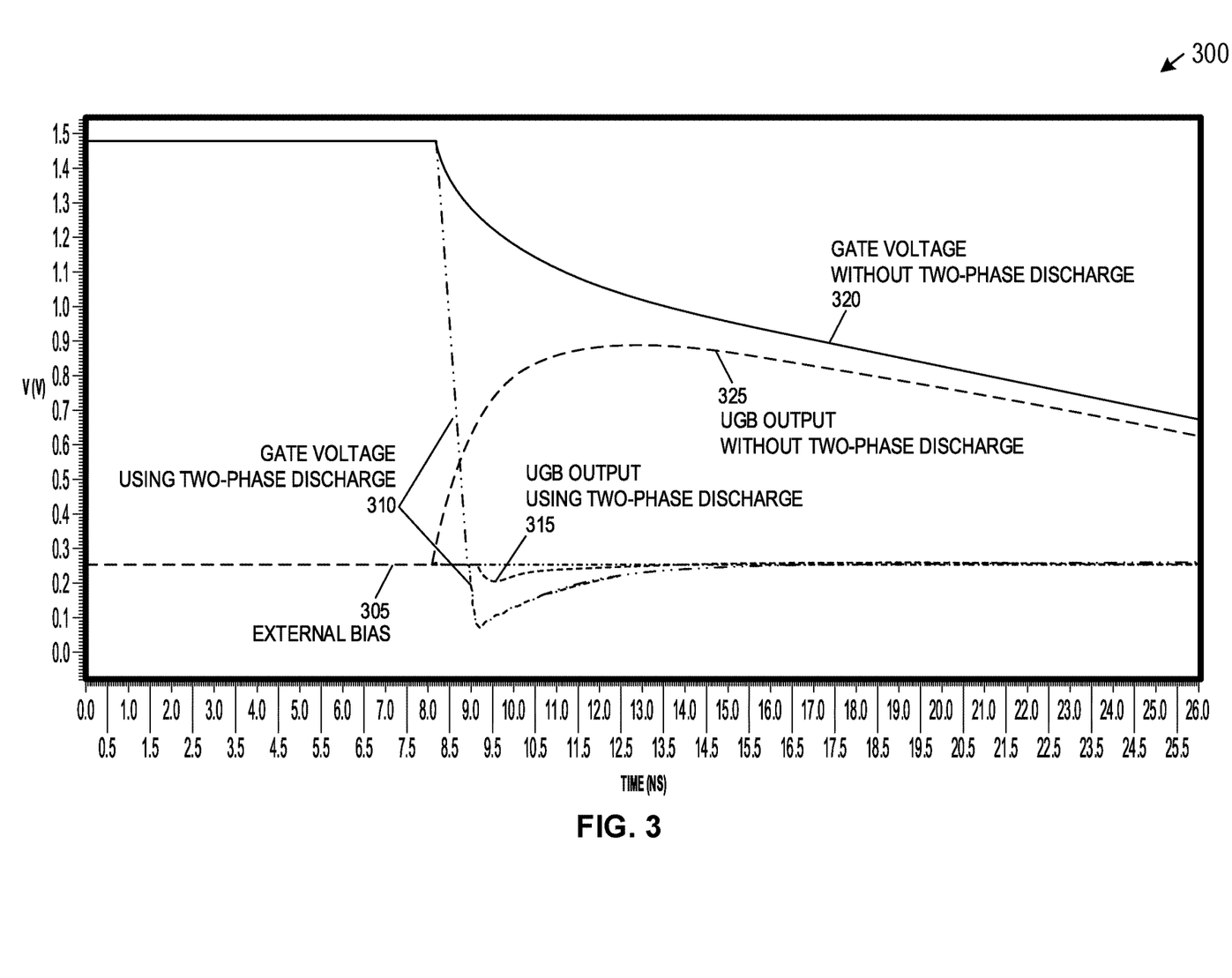
FIG. 3 is graph illustrating power transistor simulation results, according to an embodiment.

FIG. 3 is graph illustrating power transistor simulation results 300, according to an embodiment. Simulation results 300 show gate voltage and $V_{bias}$ as provided by a UGB. Gate voltage using the two-phase discharge 310 drops quickly past the external bias 305 and recovers back to the external bias 305. The UGB output using the two-phase discharge 315 also decreases slightly when the gate voltage 310 crosses the external bias 305 and the UGB output 315 is coupled to the gate voltage 310, and the UGB output 315 also recovers back to the external bias 305. In contrast, gate voltage without the two-phase discharge 320 drops slowly toward the external bias 305 and the UGB output without the two-phase discharge 325 rises to meet the gate voltage 320. Simulation results indicate the gate voltage without the two-phase discharge 320 would result in an approximately tenfold increase in the switching time over gate voltage using the two-phase discharge 310. To modify the capacitance to reduce the switching time of the gate voltage without the two-phase discharge 320 may require five to ten times as much capacitance on the gate node, which would result in significant increases in silicon area usage. The gate voltage using the two-phase discharge 310 provides substantial advantages in timing speed and silicon area usage.

Figure 4:
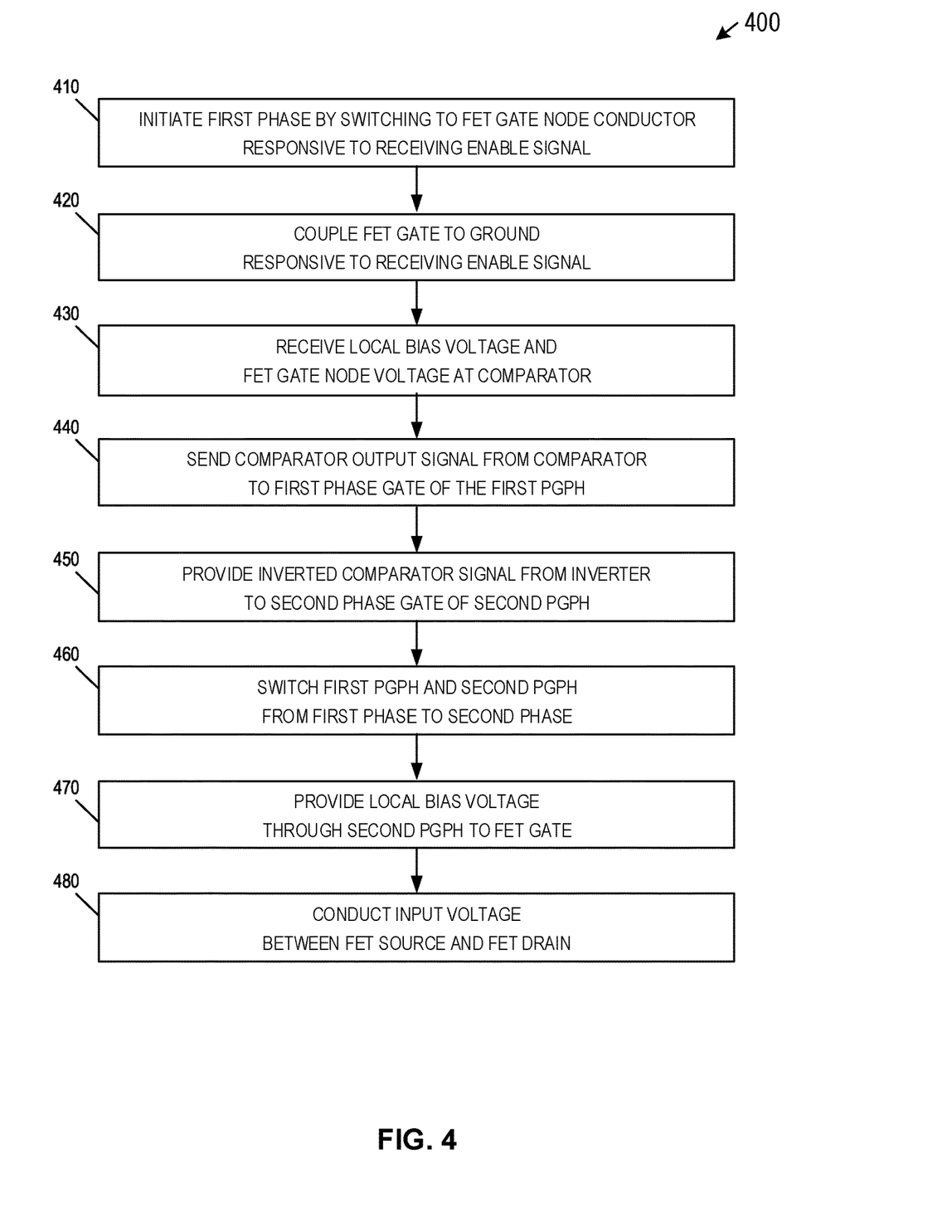
FIG. 4 is a flowchart illustrating a method, according to an embodiment.

FIG. 4 is a flowchart illustrating a method 400, according to an embodiment. Method 400 includes initiating 410 a first phase by switching a FET gate from an input voltage to a FET gate node conductor. Method 400 includes coupling 420 the FET gate to a ground. Initiating 410 the first phase and coupling 420 the FET gate to ground may be in response to receiving an enable signal at a FET gate switch and at a first phase gate of the first PGPH.

Method 400 includes receiving 430 a local bias voltage and a FET gate node voltage at a comparator, and includes sending 440 a comparator output signal from the comparator to the first phase gate of the first PGPH. The FET gate node voltage may be received from a FET with a FET gate. The FET gate may be conductively coupled through a FET gate node conductor to the comparator during a first phase.

Method 400 includes providing 450 the inverted comparator signal from the inverter to a second phase gate of the second PGPH. The inverted comparator signal may be generated at the inverter based on a comparator output signal received at an inverter from the comparator.

Method 400 includes switching 460 a first phase pass gate (PGPH) and a second PGPH from the first phase to a second phase, where switching 460 occurs when the FET gate node voltage transgresses the voltage bias threshold. The FET gate may be switchably coupled through the first PGPH to a ground during the first phase, and may be switchably coupled through the second PGPH to a local bias voltage during the second phase. Switching the second PGPH from the first phase to the second phase may be subsequent to the first PGPH switching from the first phase to the second phase.

Method 400 includes providing 470 a local bias voltage through the second PGPH to FET gate. The local bias voltage may be generated at a unity gain buffer based on a control unit bias voltage received at the unity gain buffer. The unity gain buffer may be conductively coupled to the second PGPH. Method 400 includes conducting 480 an input voltage between a FET source and a FET drain responsive to the coupling of the FET gate to the local bias voltage during the second phase. The FET may form all or a portion of a biased output power stage. In an example, multiple FET devices are conductively coupled in parallel with the FET to form a power stage transistor cluster.

Figure 5:
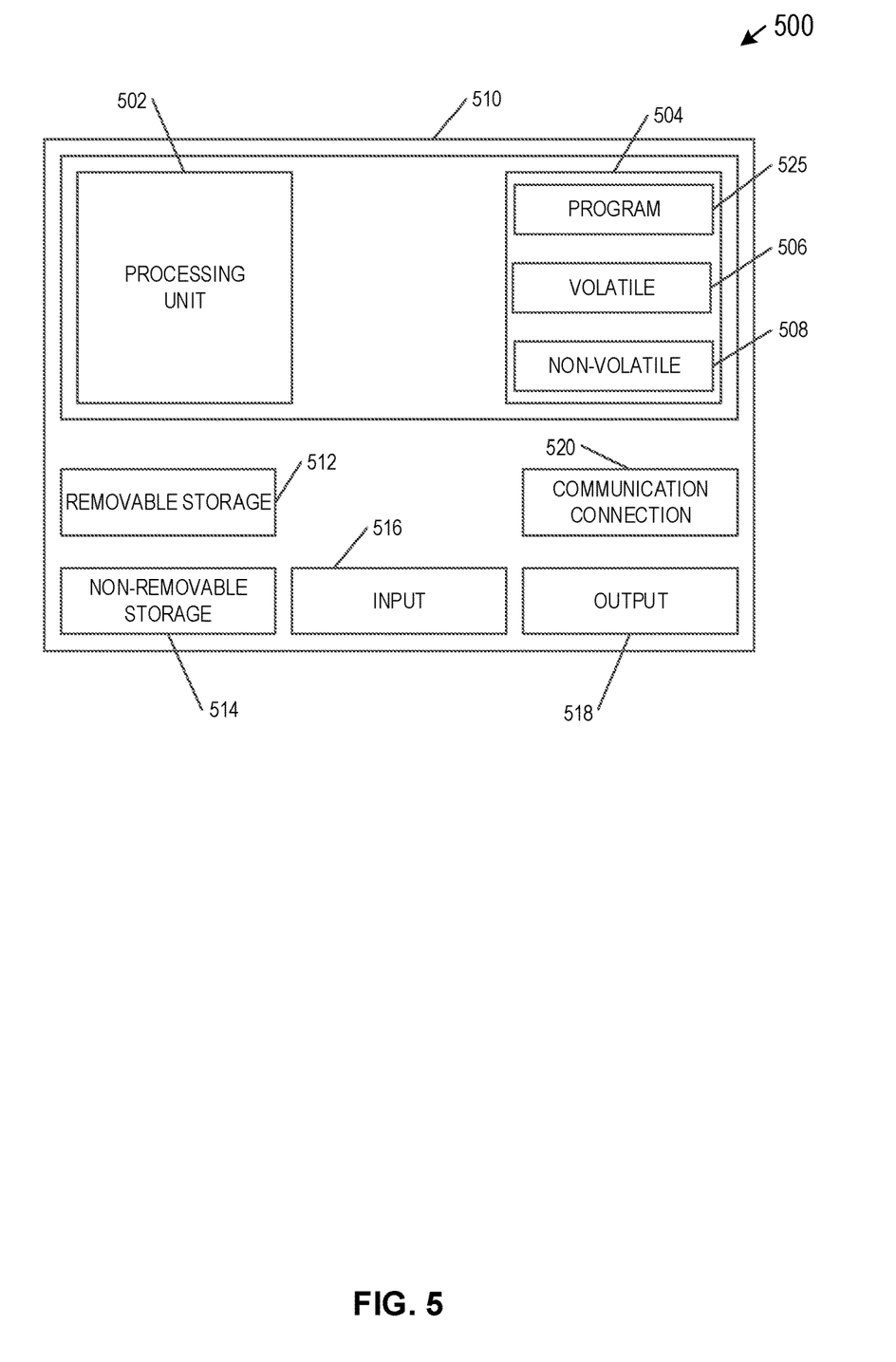
FIG. 5 is a block diagram of a computing device, according to an embodiment.

FIG. 5 is a block diagram of a computing device 500, according to an embodiment. The performance of one or more components within computing device 500 may be improved by including one or more of the circuits or circuitry methods described herein. Computing device 500 may include a field-effect transistor (FET) with a FET gate, a switch including a first switch terminal coupled to the FET gate, a first phase pass gate (PGPH) coupled to a second switch terminal of the switch, a second PGPH coupled to the second switch terminal of the switch, an inverter coupled to the second PGPH, and a comparator. The comparator may include a comparator output node coupled to the inverter and to a first gate of the first PGPH, a first comparator input node coupled to a second switch terminal of the switch, and a second comparator output node coupled to a local bias voltage node. Computing device 500 may further include a unity gain buffer (UGB), the UGB including a buffer input node coupled to a control unit bias voltage node and a buffer output node coupled to the local bias voltage node. The FET may include a p-channel metallic oxide semiconductor (PMOS) with a PMOS drain node coupled to ground. The FET may include an n-channel metallic oxide semiconductor (NMOS) with an NMOS source coupled to a supply voltage. A plurality of FET devices may be conductively coupled in parallel with the FET to form a power stage transistor cluster.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 5 is an example of a client device that may invoke methods described herein over a network. In other embodiments, the computing device is an example of a computing device that may be included in or connected to a motion interactive video projection system, as described elsewhere herein. In some embodiments, the computing device of FIG. 5 is an example of one or more of the personal computer, smartphone, tablet, or various servers.

One example computing device in the form of a computer 510, may include a processing unit 502, memory 504, removable storage 512, and non-removable storage 514. Although the example computing device is illustrated and described as computer 510, the computing device may be in different forms in different embodiments. For example, the computing device may instead be a smartphone, a tablet, or other computing device including the same or similar elements as illustrated and described with regard to FIG. 5. Further, although the various data storage elements are illustrated as part of the computer 510, the storage may include cloud-based storage accessible via a network, such as the Internet.

Returning to the computer 510, memory 504 may include volatile memory 506 and non-volatile memory 508. Computer 510 may include or have access to a computing environment that includes a variety of computer-readable media, such as volatile memory 506 and non-volatile memory 508, removable storage 512 and non-removable storage 514. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 510 may include or have access to a computing environment that includes input 516, output 518, and a communication connection 520. The input 516 may include one or more of a touchscreen, touchpad, mouse, keyboard, camera, and other input devices. The input 516 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 520 to connect to one or more remote computers, such as database servers, web servers, and another computing device. An example remote computer may include a personal computer (PC), server, router, network PC, a peer device or other common network node, or the like. The communication connection 520 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 502 of the computer 510. A hard drive (magnetic disk or solid state), CD-ROM, and RAM are some examples of articles including a non-transitory computer-readable medium. For example, various computer programs 525 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

Additional Notes and Examples

Example 1 is an apparatus comprising: a field-effect transistor (FET) with a FET gate; a FET gate node conductor conductively coupled to the FET gate during a first phase, the FET gate node conductor having an associated FET gate node voltage; a first phase pass gate (PGPH), the FET gate switchably coupled through the first PGPH during the first phase; a second PGPH, the FET gate switchably coupled through the second PGPH to a local bias voltage during a second phase; and a comparator to: receive the FET gate node voltage and the local bias voltage; and switch the first PGPH and second PGPH from the first phase to the second phase responsive to the FET gate node voltage transgressing a bias voltage threshold associated with the local bias voltage.

In Example 2, the subject matter of Example 1 includes, the FET further including a FET source and a FET drain, wherein the FET conducts an input voltage between the FET source and FET drain responsive to the coupling of the FET gate to the local bias voltage during the second phase.

In Example 3, the subject matter of Example 2 includes, a FET gate switch conductively coupled to the FET gate, the FET gate switch to initiate the first phase by switching the FET gate from the input voltage to the FET gate node conductor responsive to receiving an enable signal.

In Example 4, the subject matter of Example 3 includes, wherein the FET includes a p-channel metallic oxide semiconductor (PMOS), the PMOS switchably coupled through the first PGPH to a ground during the first phase.

In Example 5, the subject matter of Example 4 includes, wherein the first PGPH couples the FET gate to the ground responsive to receiving the enable signal at a first phase gate of the first PGPH.

In Example 6, the subject matter of Examples 3-5 includes, wherein the FET includes an n-channel metallic oxide semiconductor (NMOS), the NMOS switchably coupled through the first PGPH to a supply voltage during the first phase.

In Example 7, the subject matter of Examples 5-6 includes, wherein the first PGPH couples the FET gate to the supply voltage responsive to receiving the enable signal at a first phase gate of the first PGPH.

In Example 8, the subject matter of Examples 3-7 includes, wherein the comparator switching the first PGPH from the first phase to the second phase includes the comparator sending a comparator output signal to the first phase gate of the first PGPH.

In Example 9, the subject matter of Example 8 includes, an inverter conductively coupled between the comparator and the second PGPH, the inverter to: receive the comparator output signal from the comparator; generate an inverted comparator signal based on the comparator output signal; and provide the inverted comparator signal to a second phase gate of the second PGPH.

In Example 10, the subject matter of Example 9 includes, wherein the second PGPH is configured to switch from the first phase to the second phase subsequent to the first PGPH switching from the first phase to the second phase.

In Example 11, the subject matter of Examples 1-10 includes, a unity gain buffer conductively coupled to the second PGPH, the unity gain buffer to: receive a control unit bias voltage; generate the local bias voltage based on the control unit bias voltage; and provide the local bias voltage to the second PGPH.

In Example 12, the subject matter of Examples 1-11 includes, wherein the FET forms a biased output power stage.

In Example 13, the subject matter of Examples 1-12 includes, a plurality of FET devices conductively coupled in parallel with the FET to form a power stage transistor cluster.

Example 14 is a method comprising: receiving a local bias voltage and a field-effect transistor (FET) gate node voltage at a comparator, the FET gate node voltage received from a FET with a FET gate conductively coupled through a FET gate node conductor to the comparator during a first phase; and switching a first phase pass gate (PGPH) and a second PGPH from the first phase to a second phase responsive to the FET gate node voltage transgressing a bias voltage threshold associated with the local bias voltage, the FET gate switchably coupled through the first PGPH during the first phase and switchably coupled through the second PGPH to a local bias voltage during the second phase.

In Example 15, the subject matter of Example 14 includes, conducting an input voltage between a FET source and a FET drain responsive to the coupling of the FET gate to the local bias voltage during the second phase.

In Example 16, the subject matter of Example 15 includes, initiating the first phase by switching, at a FET gate switch conductively coupled to the FET gate, the FET gate from the input voltage to the FET gate node conductor responsive to receiving an enable signal.

In Example 17, the subject matter of Example 16 includes, wherein the FET includes a p-channel metallic oxide semiconductor (PMOS), the PMOS switchably coupled through the first PGPH to a ground during the first phase.

In Example 18, the subject matter of Example 17 includes, coupling, at the first PGPH, the FET gate to the ground responsive to receiving the enable signal at a first phase gate of the first PGPH.

In Example 19, the subject matter of Examples 16-18 includes, wherein the FET includes an n-channel metallic oxide semiconductor (NMOS), the NMOS switchably coupled through the first PGPH to a supply voltage during the first phase.

In Example 20, the subject matter of Examples 18-19 includes, coupling, at the first PGPH, the FET gate to the supply voltage responsive to receiving the enable signal at a first phase gate of the first PGPH.

In Example 21, the subject matter of Examples 16-20 includes, wherein switching the first PGPH from the first phase to the second phase includes sending a comparator output signal from the comparator to the first phase gate of the first PGPH.

In Example 22, the subject matter of Example 21 includes, receiving the comparator output signal at an inverter from the comparator; generating an inverted comparator signal at the inverter based on the comparator output signal; and providing the inverted comparator signal from the inverter to a second phase gate of the second PGPH.

In Example 23, the subject matter of Example 22 includes, switching, at the second PGPH, from the first phase to the second phase subsequent to the first PGPH switching from the first phase to the second phase.

In Example 24, the subject matter of Examples 14-23 includes, receiving a control unit bias voltage at a unity gain buffer conductively coupled to the second PGPH; generating the local bias voltage at the unity gain buffer based on the control unit bias voltage; and providing the local bias voltage to the second PGPH.

In Example 25, the subject matter of Examples 14-24 includes, wherein the FET forms a biased output power stage.

In Example 26, the subject matter of Examples 14-25 includes, wherein a plurality of FET devices are conductively coupled in parallel with the FET to form a power stage transistor cluster.

Example 27 is at least one non-transitory machine-readable storage medium, comprising a plurality of instructions that, responsive to being executed with processor circuitry of a computer-controlled device, cause the processing circuitry to: receive a local bias voltage and a field-effect transistor (FET) gate node voltage at a comparator, the FET gate node voltage received from a FET with a FET gate conductively coupled through a FET gate node conductor to the comparator during a first phase; switch a first phase pass gate (PGPH) and a second PGPH from the first phase to a second phase responsive to the FET gate node voltage transgressing a bias voltage threshold associated with the local bias voltage, the FET gate switchably coupled through the first PGPH during the first phase and switchably coupled through the second PGPH to a local bias voltage during the second phase.

In Example 28, the subject matter of Example 27 includes, the instructions further causing the processing circuitry to conduct an input voltage between a FET source and a FET drain responsive to the coupling of the FET gate to the local bias voltage during the second phase.

In Example 29, the subject matter of Example 28 includes, the instructions further causing the processing circuitry to initiate the first phase by switching, at a FET gate switch conductively coupled to the FET gate, the FET gate from the input voltage to the FET gate node conductor responsive to receiving an enable signal.

In Example 30, the subject matter of Example 29 includes, wherein the FET includes a p-channel metallic oxide semiconductor (PMOS), the PMOS switchably coupled through the first PGPH to a ground during the first phase.

In Example 31, the subject matter of Example 30 includes, the instructions further causing the processing circuitry to couple, at the first PGPH, the FET gate to the ground responsive to receiving the enable signal at a first phase gate of the first PGPH.

In Example 32, the subject matter of Examples 29-31 includes, wherein the FET includes an n-channel metallic oxide semiconductor (NMOS), the NMOS switchably coupled through the first PGPH to a supply voltage during the first phase.

In Example 33, the subject matter of Examples 31-32 includes, the instructions further causing the processing circuitry to couple, at the first PGPH, the FET gate to the supply voltage responsive to receiving the enable signal at a first phase gate of the first PGPH.

In Example 34, the subject matter of Examples 29-33 includes, wherein switching the first PGPH from the first phase to the second phase includes sending a comparator output signal from the comparator to the first phase gate of the first PGPH.

In Example 35, the subject matter of Example 34 includes, the instructions further causing the processing circuitry to: receive the comparator output signal at an inverter from the comparator; generate an inverted comparator signal at the inverter based on the comparator output signal; and provide the inverted comparator signal from the inverter to a second phase gate of the second PGPH.

In Example 36, the subject matter of Example 35 includes, the instructions further causing the processing circuitry to switch, at the second PGPH, from the first phase to the second phase subsequent to the first PGPH switching from the first phase to the second phase.

In Example 37, the subject matter of Examples 27-36 includes, the instructions further causing the processing circuitry to: receiving a control unit bias voltage at a unity gain buffer conductively coupled to the second PGPH; generating the local bias voltage at the unity gain buffer based on the control unit bias voltage; and providing the local bias voltage to the second PGPH.

In Example 38, the subject matter of Examples 27-37 includes, wherein the FET forms a biased output power stage.

In Example 39, the subject matter of Examples 27-38 includes, wherein a plurality of FET devices are conductively coupled in parallel with the FET to form a power stage transistor cluster.

Example 40 is an apparatus comprising: means for receiving a local bias voltage and a field-effect transistor (FET) gate node voltage at a comparator, the FET gate node voltage received from a FET with a FET gate conductively coupled through a FET gate node conductor to the comparator during a first phase; means for switching a first phase pass gate (PGPH) and a second PGPH from the first phase to a second phase responsive to the FET gate node voltage transgressing a bias voltage threshold associated with the local bias voltage, the FET gate switchably coupled through the first PGPH during the first phase and switchably coupled through the second PGPH to a local bias voltage during the second phase.

In Example 41, the subject matter of Example 40 includes, means for conducting an input voltage between a FET source and a FET drain responsive to the coupling of the FET gate to the local bias voltage during the second phase.

In Example 42, the subject matter of Example 41 includes, means for initiating the first phase by switching, at a FET gate switch conductively coupled to the FET gate, the FET gate from the input voltage to the FET gate node conductor responsive to receiving an enable signal.

In Example 43, the subject matter of Example 42 includes, wherein the FET includes a p-channel metallic oxide semiconductor (PMOS), the PMOS switchably coupled through the first PGPH to a ground during the first phase.

In Example 44, the subject matter of Example 43 includes, means for coupling, at the first PGPH, the FET gate to the ground responsive to receiving the enable signal at a first phase gate of the first PGPH.

In Example 45, the subject matter of Examples 42-44 includes, wherein the FET includes an n-channel metallic oxide semiconductor (NMOS), the NMOS switchably coupled through the first PGPH to a supply voltage during the first phase.

In Example 46, the subject matter of Examples 44-45 includes, means for coupling, at the first PGPH, the FET gate to the supply voltage responsive to receiving the enable signal at a first phase gate of the first PGPH.

In Example 47, the subject matter of Examples 42-46 includes, wherein switching the first PGPH from the first phase to the second phase includes sending a comparator output signal from the comparator to the first phase gate of the first PGPH.

In Example 48, the subject matter of Example 47 includes, means for receiving the comparator output signal at an inverter from the comparator; means for generating an inverted comparator signal at the inverter based on the comparator output signal; and means for providing the inverted comparator signal from the inverter to a second phase gate of the second PGPH.

In Example 49, the subject matter of Example 48 includes, means for switching, at the second PGPH, from the first phase to the second phase subsequent to the first PGPH switching from the first phase to the second phase.

In Example 50, the subject matter of Examples 40-49 includes, means for: means for receiving a control unit bias voltage at a unity gain buffer conductively coupled to the second PGPH; means for generating the local bias voltage at the unity gain buffer based on the control unit bias voltage; and means for providing the local bias voltage to the second PGPH.

In Example 51, the subject matter of Examples 40-50 includes, wherein the FET forms a biased output power stage.

In Example 52, the subject matter of Examples 40-51 includes, wherein a plurality of FET devices are conductively coupled in parallel with the FET to form a power stage transistor cluster.

Example 53 is an apparatus comprising: a field-effect transistor (FET) with a FET gate; a switch including a first switch terminal coupled to the FET gate; a first phase pass gate (PGPH) coupled to a second switch terminal of the switch; a second PGPH coupled to the second switch terminal of the switch; an inverter coupled to the second PGPH; and a comparator including: a comparator output node coupled to the inverter and to a first gate of the first PGPH; a first comparator input node coupled to a second switch terminal of the switch; and a second comparator output node coupled to a local bias voltage node.

In Example 54, the subject matter of Example 53 includes, a unity gain buffer including: a buffer input node coupled to a control unit bias voltage node; and a buffer output node coupled to the local bias voltage node.

In Example 55, the subject matter of Examples 53-54 includes, wherein the FET includes a p-channel metallic oxide semiconductor (PMOS) with a PMOS drain node coupled to ground.

In Example 56, the subject matter of Examples 53-55 includes, wherein the FET includes an n-channel metallic oxide semiconductor (NMOS) with an NMOS source coupled to a supply voltage.

In Example 57, the subject matter of Examples 53-56 includes, a plurality of FET devices conductively coupled in parallel with the FET to form a power stage transistor cluster.

Example 58 is at least one machine-readable medium including instructions that, when executed by processing circuitry, cause the processing circuitry to perform operations to implement of any of Examples 1-57.

Example 59 is an apparatus comprising means to implement of any of Examples 1-57.

Example 60 is a system to implement of any of Examples 1-57.

Example 61 is a method to implement of any of Examples 1-57.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. An apparatus comprising:
a field-effect transistor (FET) with a FET gate;
a FET gate node conductor conductively coupled to the FET gate during a first phase, the FET gate node conductor having an associated FET gate node voltage;
a first phase pass gate (PGPH), the FET gate switchably coupled through the first PGPH during the first phase;
a second PGPH, the FET gate switchably coupled through the second PGPH to a local bias voltage during a second phase; and
a comparator to:
receive the FET gate node voltage and the local bias voltage; and
switch the first PGPH and second PGPH from the first phase to the second phase responsive to the FET gate node voltage transgressing a bias voltage threshold associated with the local bias voltage.

2. The apparatus of claim 1, the FET further including a FET source and a FET drain, wherein the FET conducts an input voltage between the FET source and FET drain responsive to the coupling of the FET gate to the local bias voltage during the second phase.

3. The apparatus of claim 2, further including a FET gate switch conductively coupled to the FET gate, the FET gate switch to initiate the first phase by switching the FET gate from the input voltage to the FET gate node conductor responsive to receiving an enable signal.

4. The apparatus of claim 3, wherein the FET includes a p-channel metallic oxide semiconductor (PMOS), the PMOS switchably coupled through the first PGPH to a ground during the first phase.

5. The apparatus of claim 4, wherein the first PGPH couples the FET gate to the ground responsive to receiving the enable signal at a first phase gate of the first PGPH.

6. The apparatus of claim 3, wherein the FET includes an n-channel metallic oxide semiconductor (NMOS), the NMOS switchably coupled through the first PGPH to a supply voltage during the first phase.

7. The apparatus of claim 6, wherein the first PGPH couples the FET gate to the supply voltage responsive to receiving the enable signal at a first phase gate of the first PGPH.

8. The apparatus of claim 3, wherein the comparator switching the first PGPH from the first phase to the second phase includes the comparator sending a comparator output signal to the first phase gate of the first PGPH.

9. The apparatus of claim 8, further including an inverter conductively coupled between the comparator and the second PGPH, the inverter to:
receive the comparator output signal from the comparator;
generate an inverted comparator signal based on the comparator output signal; and
provide the inverted comparator signal to a second phase gate of the second PGPH.

10. The apparatus of claim 9, wherein the second PGPH is configured to switch from the first phase to the second phase subsequent to the first PGPH switching from the first phase to the second phase.

11. The apparatus of claim 1, further including a unity gain buffer conductively coupled to the second PGPH, the unity gain buffer to:
receive a control unit bias voltage;
generate the local bias voltage based on the control unit bias voltage; and
provide the local bias voltage to the second PGPH.

12. A method comprising:
receiving a local bias voltage and a field-effect transistor (FET) gate node voltage at a comparator, the FET gate node voltage received from a FET with a FET gate conductively coupled through a FET gate node conductor to the comparator during a first phase; and
switching a first phase pass gate (PGPH) and a second PGPH from the first phase to a second phase responsive to the FET gate node voltage transgressing a bias voltage threshold associated with the local bias voltage, the FET gate switchably coupled through the first PGPH during the first phase and switchably coupled through the second PGPH to a local bias voltage during the second phase.

13. The method of claim 12, further including conducting an input voltage between a FET source and a FET drain responsive to the coupling of the FET gate to the local bias voltage during the second phase.

14. The method of claim 13, further including initiating the first phase by switching, at a FET gate switch conductively coupled to the FET gate, the FET gate from the input voltage to the FET gate node conductor responsive to receiving an enable signal.

15. The method of claim 14, wherein switching the first PGPH from the first phase to the second phase includes sending a comparator output signal from the comparator to the first phase gate of the first PGPH.

16. An apparatus comprising:
a field-effect transistor (FET) with a FET gate;
a switch including a first switch terminal coupled to the FET gate;
a first phase pass gate (PGPH) coupled to a second switch terminal of the switch;
a second PGPH coupled to the second switch terminal of the switch;
an inverter coupled to the second PGPH; and
a comparator including:
a comparator output node coupled to the inverter and to a first gate of the first PGPH;
a first comparator input node coupled to a second switch terminal of the switch; and
a second comparator output node coupled to a local bias voltage node.

17. The apparatus of claim 16, further including a unity gain buffer including:
a buffer input node coupled to a control unit bias voltage node; and
a buffer output node coupled to the local bias voltage node.

18. The apparatus of claim 16, wherein the FET includes a p-channel metallic oxide semiconductor (PMOS) with a PMOS drain node coupled to ground.

19. The apparatus of claim 16, wherein the FET includes an n-channel metallic oxide semiconductor (NMOS) with an NMOS source coupled to a supply voltage.

20. The apparatus of claim 16, further including a plurality of FET devices conductively coupled in parallel with the FET to form a power stage transistor cluster.

* * * * *